(12) United States Patent
Saiki et al.

(10) Patent No.: US 9,817,346 B2
(45) Date of Patent: Nov. 14, 2017

(54) ELECTRONIC APPARATUS AND IMAGE FORMING APPARATUS WITH THERMOELECTRIC CONVERTERS

(71) Applicant: FUJI XEROX CO., LTD., Tokyo (JP)

(72) Inventors: Takaki Saiki, Kanagawa (JP); Seiji Honda, Kanagawa (JP); Kunihito Sato, Kanagawa (JP); Junichi Iwasaki, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 14/637,525

(22) Filed: Mar. 4, 2015

(65) Prior Publication Data

US 2015/0261152 A1  Sep. 17, 2015

(30) Foreign Application Priority Data

Mar. 13, 2014  (JP) ................. 2014-050754

(51) Int. Cl.
 *G03G 15/20* (2006.01)
 *H01L 23/38* (2006.01)
 *H01L 35/32* (2006.01)

(52) U.S. Cl.
 CPC ..... *G03G 15/2053* (2013.01); *G03G 15/2017* (2013.01); *H01L 35/32* (2013.01); *H01L 35/325* (2013.01)

(58) Field of Classification Search
 CPC . G03G 21/20; G03G 15/2053; G03G 15/2017
 USPC ................. 399/330; 136/203, 204; 257/930
 See application file for complete search history.

(56) References Cited

U.S. PATENT DOCUMENTS

| | | | | |
|---|---|---|---|---|
| 5,936,192 | A | * | 8/1999 | Tauchi ................... 136/203 |
| 8,022,335 | B2 | * | 9/2011 | Burton et al. ............ 219/216 |
| 2006/0216081 | A1 | * | 9/2006 | Sanpei ............ G03G 15/201 399/336 |
| 2007/0261729 | A1 | * | 11/2007 | Hu .......................... 136/204 |
| 2014/0083477 | A1 | * | 3/2014 | Haq ................... H01L 35/24 136/203 |

FOREIGN PATENT DOCUMENTS

| | | | |
|---|---|---|---|
| JP | 2005287090 A | * | 10/2005 |
| JP | 2006-113112 A | | 4/2006 |
| JP | 2006223079 A | | 8/2006 |
| JP | 2007-305993 A | | 11/2007 |
| JP | 2009-224684 A | | 10/2009 |

(Continued)

OTHER PUBLICATIONS

English machine translation of JP 2005-287090.*

(Continued)

*Primary Examiner* — Walter L Lindsay, Jr.
*Assistant Examiner* — Arlene Heredia Ocasio
(74) *Attorney, Agent, or Firm* — Sughrue Mion, PLLC

(57) ABSTRACT

An electronic apparatus includes a first thermoelectric converter that converts thermal energy dissipated from a heat source into electrical energy, a second thermoelectric converter provided on a side of a low-temperature portion of the first thermoelectric converter and that converts electrical energy into thermal energy, and a power supply controller that controls supply of power to the second thermoelectric converter such that the low-temperature portion of the first thermoelectric converter is cooled or heated.

13 Claims, 8 Drawing Sheets

(56) References Cited

FOREIGN PATENT DOCUMENTS

JP         4530773 B2    8/2010
JP      2013-118794 A    6/2013

OTHER PUBLICATIONS

English machine translation of JP 2006-223079.*
Communication dated Nov. 15, 2016, from the Japanese Patent Office in counterpart application No. 2014-050754.
Communication dated Mar. 21, 2017 from the Japanese Patent Office in counterpart Application No. 2014-050754.

* cited by examiner

ELECTRONIC APPARATUS AND IMAGE FORMING APPARATUS WITH THERMOELECTRIC CONVERTERS

CROSS-REFERENCE TO RELATED APPLICATIONS

This application is based on and claims priority under 35 USC 119 from Japanese Patent Application No. 2014-050754 filed Mar. 13, 2014.

BACKGROUND

Technical Field

The present invention relates to an electronic apparatus and an image forming apparatus.

SUMMARY

According to an aspect of the invention, there is provided an electronic apparatus including a first thermoelectric converter that converts thermal energy dissipated from a heat source into electrical energy, a second thermoelectric converter provided on a side of a low-temperature portion of the first thermoelectric converter and that converts electrical energy into thermal energy, and a power supply controller that controls supply of power to the second thermoelectric converter such that the low-temperature portion of the first thermoelectric converter is cooled or heated.

BRIEF DESCRIPTION OF THE DRAWINGS

Exemplary embodiments of the present invention will be described in detail based on the following figures, wherein.

DETAILED DESCRIPTION

First Exemplary Embodiment

Figure 1:
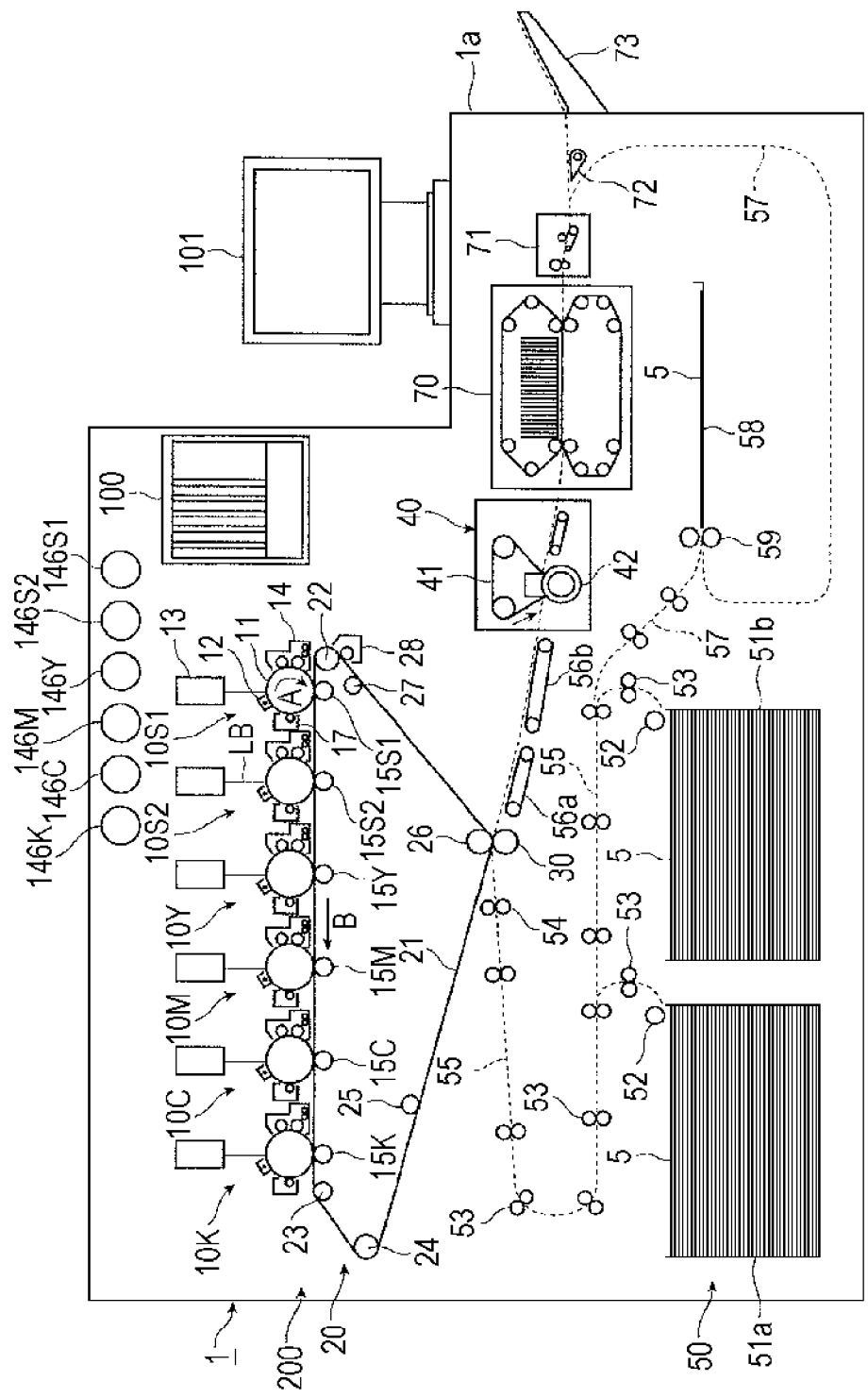
FIG. 1 is a schematic diagram of an image forming apparatus as an exemplary electronic apparatus according to a first exemplary embodiment of the present invention.
Figure 2:
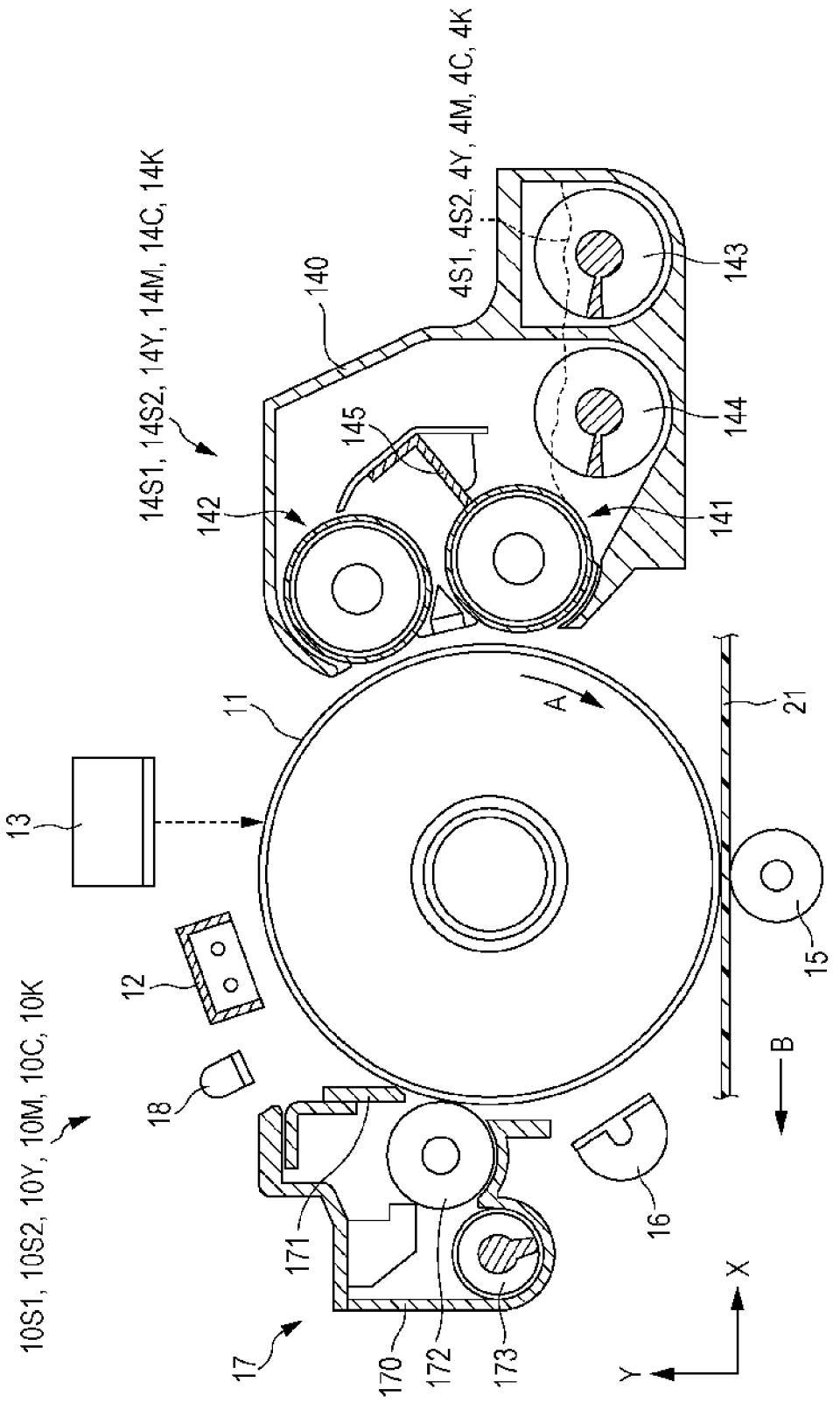
FIG. 2 is a diagram of an imaging unit.

FIGS. 1 and 2 illustrate an image forming apparatus 1 as an exemplary electronic apparatus according to a first exemplary embodiment of the present invention. FIG. 1 illustrates an outline of the image forming apparatus 1. FIG. 2 is an enlarged view of relevant elements (an imaging device and associated elements) included in the image forming apparatus 1.

Outline of Image Forming Apparatus

The image forming apparatus 1 according to the first exemplary embodiment is, for example, a color printer. The image forming apparatus 1 includes an image forming section 200 as an exemplary image forming unit that forms an image on a recording medium on the basis of image data. The image forming section 200 of the image forming apparatus 1 includes plural imaging devices 10 that form toner images through development with toners contained in developers 4, respectively, an intermediate transfer device 20 that carries the toner images formed by the imaging devices 10 and transports the toner images to a second transfer position where the toner images are ultimately transferred, for a second transfer, to recording paper 5 as an exemplary recording medium, and a paper feeding device 50 that stores pieces of recording paper 5 of predetermined sizes or the like and feeds each of the pieces of recording paper 5 that is to be supplied to the second transfer position defined in the intermediate transfer device 20. The toner images transferred to the recording paper 5 in the second transfer performed by the intermediate transfer device 20 are fixed with heat in a fixing device 40.

A housing 1a of the image forming apparatus 1 includes support-structure members, an exterior covering, and so forth. The broken lines illustrated in FIG. 1 represent major transport paths along which the recording paper 5 is transported in the housing 1a.

The plural imaging devices 10 are six imaging devices 10Y, 10M, 10C, 10K, 10S1, and 10S2 dedicated for forming toner images in four colors of yellow (Y), magenta (M), cyan (C), and black (K) and toner images in two special colors S1 and S2, respectively. The six imaging devices 10 (S1, S2, Y, M, C, and K) are arranged in a line in the housing 1a.

As illustrated in FIGS. 1 and 2, the imaging devices 10 (S1, S2, Y, M, C, and K) each include a rotatable photoconductor drum 11 as an exemplary image carrying body, around which the following devices are provided, basically. A charging device 12 charges the circumferential surface (an image carrying surface) of the photoconductor drum 11, on which an image is to be formed, to a predetermined potential. An exposure device 13 as an electrostatic-latent-image-forming unit forms an electrostatic latent image (for a corresponding one of the above colors) by applying light LB to the charged circumferential surface of the photoconductor drum 11 on the basis of image information (a signal). The electrostatic latent image thus formed has a potential difference from the charged surface of the photoconductor drum 11. A developing device 14 (S1, S2, Y, M, C, or K) as a developing unit develops the electrostatic latent image into a toner image with the toner contained in a corresponding one of the developers 4 provided for the respective colors (S1, S2, Y, M, C, and K). A first transfer device 15 transfers, for a first transfer, the toner image to the intermediate transfer device 20. A pre-cleaning charging device 16 that charges substances, such as the toner, remaining on the image carrying surface of the photoconductor drum 11 that has undergone the first transfer. A drum cleaning device 17 cleans the photoconductor drum 11 by removing the charged substances. A static eliminator 18 eliminates the static electricity from the image carrying surface of the photoconductor drum 11 that has been cleaned.

The photoconductor drum 11 includes a cylindrical or round-columnar base member that is grounded, and a photoconductive layer (photosensitive layer) made of a photosensitive material and provided over the circumferential surface of the base member. The photoconductive layer forms the image carrying surface. The photoconductor drum 11 receives a driving force from a rotation driving device (not illustrated) and is supported in such a manner as to be rotatable in a direction indicated by arrow A.

The charging device 12 is a non-contact charging device, such as a corona discharger, and is provided out of contact with the photoconductor drum 11. A charging voltage is applied to the charging device 12. If the developing device 14 employs a reversal development method, the polarity of the charging voltage or current is the same as the polarity of the toner charged and supplied from the developing device 14.

The exposure device 13 applies the light LB generated on the basis of image information that is input into the image forming apparatus 1 to the charged circumferential surface of the photoconductor drum 11, whereby an electrostatic latent image is formed. In accordance with the timing of formation of the electrostatic latent image, the image information (a signal) that has been input into the image forming apparatus 1 through an arbitrary device is transmitted to the exposure device 13.

As illustrated in FIG. 2, the developing device 14 (S1, S2, Y, M, C, or K) includes a housing 140. The housing 140 has an opening and a chamber in which the developer 4 is stored. The housing 140 houses two developing rollers 141 and 142, two stirring-and-transporting members 143 and 144, a layer-thickness-regulating member 145, and so forth. The developing rollers 141 and 142 carry and transport the developer 4 to two respective development areas where the developing rollers 141 and 142 face the photoconductor drum 11. The stirring-and-transporting members 143 and 144 are screw augers or the like and transport the developer 4 while stirring the developer 4 such that the developer 4 goes past the developing roller 142. The layer-thickness-regulating member 145 regulates the amount of developer 4 (the thickness of a layer of developer 4) to be carried by the developing roller 142. The developing device 14 receives a development voltage from a power supply device (not illustrated). The development voltage is applied to the nips between the photoconductor drum 11 and the respective developing rollers 141 and 142. The developing rollers 141 and 142 and the stirring-and-transporting members 143 and 144 receive driving forces from rotation driving devices (not illustrated) and thus rotate in respective predetermined directions. The developer 4 (S1, S2, Y, M, C, or K) for each of the six colors is a two-component developer composed of a nonmagnetic toner and a magnetic carrier. Referring to FIG. 1, developer containers 146 (S1, S2, Y, M, C, and K) store the developers 4 containing at least the toners to be supplied to the developing devices 14 (S1, S2, Y, M, C, and K), respectively.

The first transfer device 15 is a contact transfer device and includes a first transfer roller that rotates while being in contact with the circumferential surface of the photoconductor drum 11 and to which a first transfer voltage is applied. A direct-current voltage having a polarity opposite to that of the toner is applied as the first transfer voltage from a power supply device (not illustrated).

Referring to FIG. 2, the drum cleaning device 17 includes a container-like body 170, a cleaning plate 171, a rotating brush roller 172, a delivering member 173, and so forth. The body 170 has an opening. The cleaning plate 171 is provided in contact at a predetermined pressure with the circumferential surface of the photoconductor drum 11 having undergone the first transfer. The cleaning plate 171 cleans the circumferential surface of the photoconductor drum 11 by removing substances, such as residual toner, therefrom. The rotating brush roller 172 is rotatably provided in contact with the circumferential surface of the photoconductor drum 11 at a position on the upstream side with respect to the cleaning plate 171 in the direction of rotation of the photoconductor drum 11. The delivering member 173, which is a screw auger or the like, collects the substances, such as the toner, removed from the photoconductor drum 11 by the cleaning plate 171 and delivers the collected substances to a collecting system (not illustrated). The cleaning plate 171 is a plate member (such as a blade) made of a material such as rubber.

Referring to FIG. 1, the intermediate transfer device 20 is provided below the imaging devices 10 (S1, S2, Y, M, C, and K). The intermediate transfer device 20 basically includes an intermediate transfer belt 21, plural belt supporting rollers 22 to 27, a second transfer device 30, and a belt cleaning device 28. The intermediate transfer belt 21 rotates in a direction indicated by arrow B while passing through first transfer positions defined between the photoconductor drums 11 and the first transfer devices 15 (first transfer rollers), respectively. The belt supporting rollers 22 to 27 are provided on the inner side of the intermediate transfer belt 21 and rotatably support and retain the intermediate transfer belt 21 in a predetermined state. The second transfer device 30 is provided on the outer side (an image carrying surface) of the intermediate transfer belt 21 and across the intermediate transfer belt 21 from the belt supporting roller 26. The second transfer device 30 transfers, for the second transfer, toner images on the intermediate transfer belt 21 to the recording paper 5. The belt cleaning device 28 cleans the intermediate transfer belt 21 by removing substances, such as the toners and paper lint, remaining on the outer circumferential surface of the intermediate transfer belt 21 that has passed through the second transfer device 30.

The intermediate transfer belt 21 is an endless belt made of a material obtained by, for example, dispersing a resistance regulating agent or the like, such as carbon black, in a synthetic resin such as polyimide or polyamide. The belt supporting roller 22 functions as a driving roller. The belt supporting rollers 23, 25, and 27 function as follower rollers that retain, for example, the position of the intermediate transfer belt 21. The belt supporting roller 24 functions as a tension applying roller. The belt supporting roller 26 functions as a backup roller intended for the second transfer.

As illustrated in FIG. 1, the second transfer device 30 is a contact transfer device and includes a second transfer roller provided at the second transfer position defined in the intermediate transfer device 20 where the outer circumferential surface of the intermediate transfer belt 21 is supported by the belt supporting roller 26. The second transfer roller rotates while being in contact with the outer circumferential surface of the intermediate transfer belt 21. A second transfer voltage, which is a direct-current voltage, having a polarity opposite to or the same as the polarity of the toners is applied to the second transfer roller of the second transfer device 30 or to the belt supporting roller 26 of the intermediate transfer device 20.

Figure 3:
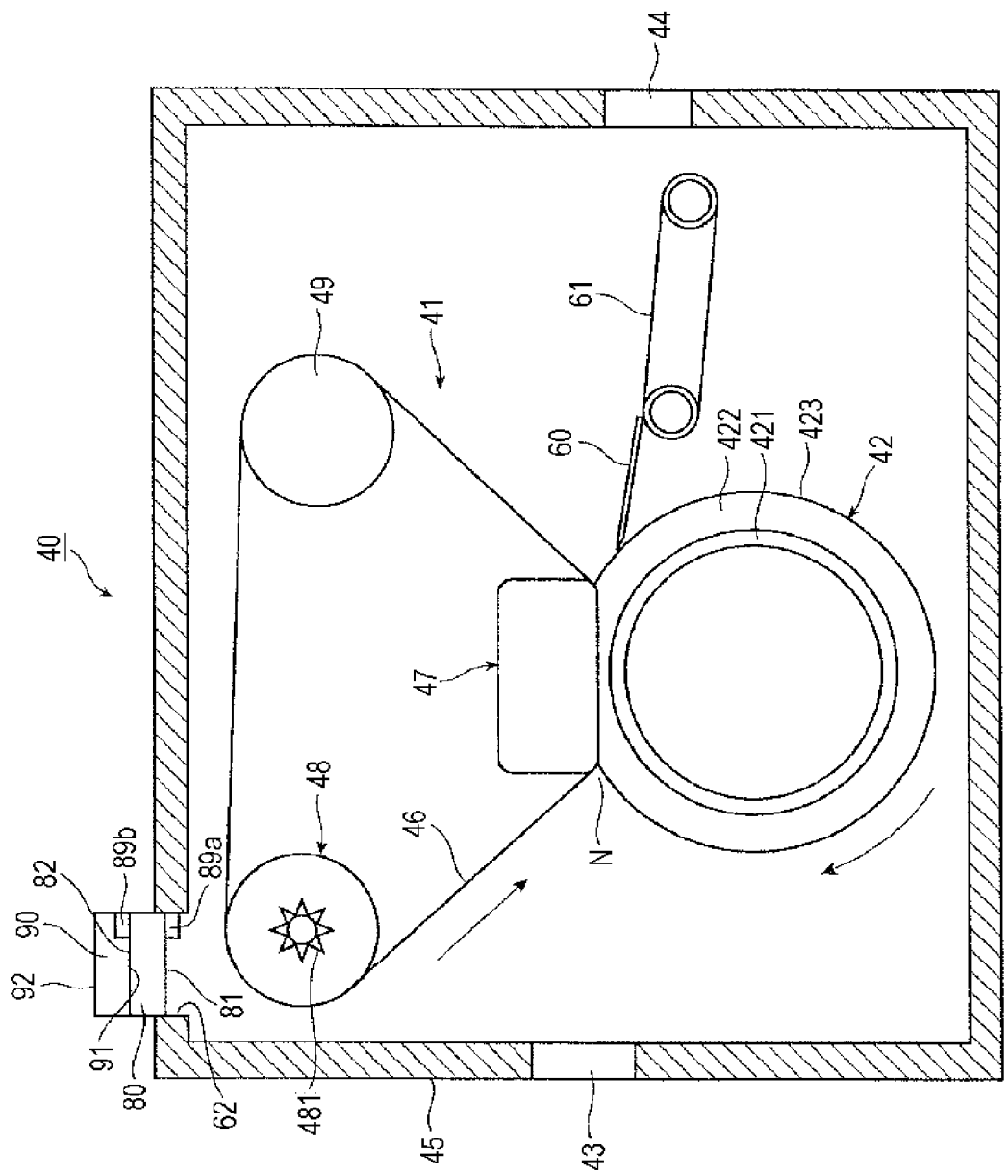
FIG. 3 is a sectional view of a fixing device.

FIG. 3 is a diagram of the fixing device 40 included in the image forming apparatus 1 according to the first exemplary embodiment.

The fixing device 40 basically includes a housing 45 having a rectangular-parallelepiped shape with an introducing port 43 and a discharge port 44 through which the recording paper 5 is transported. The housing 45 houses a fixing belt module 41 and a pressure roller 42. The fixing belt module 41 is a heating-purpose rotating member that heats the recording paper 5. The pressure roller 42 is a pressing-purpose rotating member that is movable in such a manner as to come into contact with and to move away from the fixing belt module 41. The recording paper 5 carrying the toner images that are yet to be fixed is heated and pressed at a nip N as a fixing portion produced between the fixing belt module 41 and the pressure roller 42, whereby the toner images are fixed to the recording paper 5.

The fixing belt module 41 includes a fixing belt 46, a fixed pad 47, and plural supporting rollers 48 and 49. The fixing belt 46 is an exemplary endless belt member. The fixed pad 47 is provided at a fixed position, where the fixed pad 47 is in contact with the inner side of the fixing belt 46. The fixed pad 47 is an exemplary fixed contact member that presses, from the inner side, the fixing belt 46 against the pressure roller 42. The fixing belt 46 is stretched around and is thus rotatably supported by the plural supporting rollers 48 and 49.

The plural supporting rollers 48 and 49 are a heating roller 48 and a follower roller 49. The heating roller 48 is a heating device that stretches and heats the fixing belt 46 from the inner side of the fixing belt 46. The supporting roller 49 retains the fixing belt 46 in a predetermined state after the fixing belt 46 has passed through the nip N.

The heating roller 48 as an exemplary heating device is, for example, a cylindrical roller made of aluminum or stainless steel and includes, for example, one or more halogen heaters 481 as heat sources that are provided thereinside. The surface of the heating roller 48 is heated to a predetermined temperature (190° C., for example). The heating roller 48 is also provided with a meandering correcting device (not illustrated) as a meandering correcting member that corrects the meandering of the fixing belt 46. The meandering correcting device includes detectors (end sensors, not illustrated) that detect the positions of two width-direction ends of the fixing belt 46. On the basis of the information on the positions of the two width-direction ends of the fixing belt 46 that are detected by the detectors, the meandering correcting device moves one of two axial-direction ends of the heating roller 48 in a direction intersecting the axial direction of the heating roller 48, thereby correcting the meandering of the fixing belt 46.

The follower roller 49 is, for example, a cylindrical roller made of aluminum or stainless steel. The surface of the follower roller 49 is covered with a release layer made of fluorocarbon resin. Spring members (not illustrated) are provided at two respective axial-direction ends of the follower roller 49 and press the follower roller 49 against the fixing belt 46 from the inner side of the fixing belt 46. Thus, the tension of the fixing belt 46 as a whole is set to, for example, 15 kgf.

As described above, the fixing belt 46 is an endless belt member and has a smaller heat capacity than a roller-type fixing member, and the surface of the fixing belt 46 is heated to a predetermined temperature while the fixing belt 46 is running along the heating roller 48. Therefore, even in a high-speed image forming apparatus in which the recording paper 5 is transported at a high speed, the temperature of the fixing belt 46 is raised to the predetermined fixing temperature while the fixing belt 46 undergoes one revolution. Furthermore, the angle at which the fixing belt 46 turns at the heating roller 48 is set to a large value so that the fixing belt 46 is in contact with the heating roller 48 by a wide area. Therefore, the inner side of the fixing belt 46 is heated efficiently.

The pressure roller 42 includes, for example, a base member 421, which is a cylindrical or round-columnar roller made of aluminum or stainless steel, an elastic layer 422 made of silicone rubber and provided over the outer circumferential surface of the base member 421, and a release layer 423 in the form of a tube made of perfluoro alkoxy alkane (PFA) and provided over the elastic layer 422. The pressure roller 42 is movable by a moving device (not illustrated) in such a manner as to come into contact with and to move away from the fixing belt module 41 and is rotatable in a direction of the arrow when driven by a driving device (not illustrated). The pressure roller 42 is pressed against the fixing belt 46 at the nip N, whereby the fixing belt 46 is rotatable in the direction of the arrow by following the rotation of the pressure roller 42. The rotation of the fixing belt 46 may be driven by either of the supporting rollers 48 and 49 that support the fixing belt 46.

The fixed pad 47 as an exemplary fixed contact member is made of, for example, a rigid material, such as aluminum, stainless steel, or synthetic resin, and has a substantially rectangular-tube-like or rectangular-prism-like sectional shape. The fixed pad 47 is, for example, provided on the inner side of the fixing belt 46 and extends over the entire width of the fixing belt 46 in the axial direction of the pressure roller 42, with the two ends thereof fixed to a frame (not illustrated) of the fixing device 40. The fixed pad 47 is evenly pressed against the pressure roller 42, with the fixing belt 46 interposed therebetween, over a predetermined length (10 mm to 50 mm, for example) with a predetermined load (3.0 kgf/cm² to 6.0 kgf/cm², for example), whereby the nip N is formed.

The fixing device 40 further includes, at the exit of the nip N, a releasing plate 60 that releases the recording paper 5 from the pressure roller 42, and a transport belt 61 that transports the recording paper 5.

Referring now to FIG. 1, the paper feeding device 50 is provided below the intermediate transfer device 20 and the second transfer device 30. The paper feeding device 50 basically includes one or more paper containers 51a and 51b and respective paper feeding devices 52. The paper containers 51a and 51b each contain a stack of pieces of recording paper 5 that are of a predetermined size, kind, or the like. The paper feeding devices 52 each feed the pieces of recording paper 5 one by one from a corresponding one of the paper containers 51a and 51b. The paper containers 51a and 51b are attached to the housing 1a in such a manner as to be, for example, drawable toward the front side of the housing 1a (toward the side on which the user operates the image forming apparatus 1).

A paper-feeding-and-transporting path 55 is provided between the paper feeding device 50 and the second transfer device 30. The paper-feeding-and-transporting path 55 includes plural pairs of paper transporting rollers 53 and 54 and transport guide members (not illustrated), by all of which the recording paper 5 fed from the paper feeding device 50 is transported to the second transfer position. The pair of paper transporting rollers 54 provided at a position of the paper-feeding-and-transporting path 55 that is immediately before the second transfer position function as, for example, a pair of rollers (registration rollers) that adjust the timing of transport of the recording paper 5. Two paper transporting devices 56a and 56b that are each in the form of a belt or the like are provided in a row between the second transfer device 30 and the fixing device 40. The paper transporting devices 56a and 56b transport, to the fixing device 40, the recording paper 5 that has undergone the second transfer and has been discharged from the second transfer device 30. A cooling unit 70, a decurling unit 71, and a switching member 72 are provided on the downstream side with respect to the fixing device 40 in the direction of paper transport. The cooling unit 70 cools the recording paper 5 having undergone fixing. The decurling unit 71 decurls the recording paper 5. The switching member 72 switches the direction of transport of the recording paper 5 between a direction toward a paper discharge portion 73 and a direction toward a duplex transport path 57.

The duplex transport path 57 includes an intermediate paper tray 58 that temporarily holds the recording paper 5 on one side (a first side) of which an image has been formed. The intermediate paper tray 58 is provided with a pair of feed rollers 59 that feed the recording paper 5 having been received by the intermediate paper tray 58. The front and back sides of the recording paper 5 are reversed when the recording paper 5 is received by the intermediate paper tray 58. An end of the intermediate paper tray 58 from which the recording paper 5 is fed is connected to the paper-feeding-and-transporting path 55 via a downstream portion of the duplex transport path 57.

Basic Operation of Image Forming Apparatus

A basic image forming operation performed by the image forming apparatus 1 will now be described.

The following description starts with a representative image forming operation in which a full-color image composed of toner images in four respective colors (Y, M, C, and K) is formed by using the four respective imaging devices 10 (Y, M, C, and K).

When the image forming apparatus 1 receives a command that requires an image forming operation (printing), the four imaging devices 10 (Y, M, C, and K) and associated devices including the intermediate transfer device 20, the second transfer device 30, and the fixing device 40 are activated.

In the imaging devices 10 (Y, M, C, and K), the photoconductor drums 11 are first rotated in the direction of arrow A while the surfaces thereof are charged by the charging devices 12 so as to have a predetermined polarity (the negative polarity in the first exemplary embodiment) and a predetermined potential. Subsequently, the exposure devices 13 apply the light LB to the charged surfaces of the photoconductor drums 11. The light LB is emitted on the basis of image signals obtained by converting the image information that has been input to the image forming apparatus 1 into pieces of information for the respective colors (Y, M, C, and K). Thus, electrostatic latent images for the respective colors that have predetermined potential differences from the charged surfaces of the photoconductor drums 11 are formed on the surfaces of the photoconductor drums 11.

Subsequently, the developing devices 14 (Y, M, C, and K) supply the toners having the respective colors (Y, M, C, and K) to the electrostatic latent images for the respective colors that have been formed on the photoconductor drums 11. The toners have been charged in advance to a predetermined polarity (the negative polarity) and are therefore electrostatically attracted to the respective electrostatic latent images. Thus, the electrostatic latent images for the respective colors that have been formed on the photoconductor drums 11 are developed and visualized into toner images in the four respective colors (Y, M, C, and K) with the toners having the four respective colors.

Subsequently, the toner images in the respective colors formed on the photoconductor drums 11 of the imaging devices 10 (Y, M, C, and K) are transported to the respective first transfer positions, where the first transfer devices 15 transfer, for the first transfer, the respective toner images to the intermediate transfer belt 21 of the intermediate transfer device 20 that is rotating in the direction of arrow B. In the first transfer, the toner images are superposed one on top of another on the intermediate transfer belt 21.

In the imaging devices 10 that have undergone the first transfer, the pre-cleaning charging devices 16 recharge substances, such as the toners, remaining on the surfaces of the photoconductor drums 11 that have undergone the first transfer, and the drum cleaning devices 17 clean the surfaces of the photoconductor drums 11 by scraping the recharged substances. Then, the static eliminators 18 eliminate the static electricity from the surfaces of the photoconductor drums 11 that have been cleaned. Thus, the imaging devices 10 become ready for the subsequent image forming operation.

In the intermediate transfer device 20, the intermediate transfer belt 21 carrying the toner images having been transferred thereto in the first transfer rotates and transports the toner images to the second transfer position. In the paper feeding device 50, a predetermined piece of recording paper 5 is fed into the paper-feeding-and-transporting path 55 in accordance with the timing of the image forming operation. In the paper-feeding-and-transporting path 55, the pair of paper transporting rollers 54 as registration rollers deliver the recording paper 5 to the second transfer position in accordance with the timing of the second transfer.

At the second transfer position, the second transfer device 30 collectively transfer, for the second transfer, the toner images superposed on the intermediate transfer belt 21 to the recording paper 5. Meanwhile, in the intermediate transfer device 20 that has undergone the second transfer, the belt cleaning device 28 cleans the surface of the intermediate transfer belt 21 by removing substances, such as the toners, remaining on the intermediate transfer belt 21 after the second transfer.

Subsequently, the recording paper 5 now having the toner images transferred thereto in the second transfer is released from the intermediate transfer belt 21 and from the second transfer roller of the second transfer device 30 and is transported to the fixing device 40 by the paper transporting devices 56a and 56b. In the fixing device 40, a required fixing operation (application of heat and pressure) is performed on the recording paper 5 by the fixing belt 46 and the pressure roller 42, whereby the toner images that have not been fixed are fixed to the recording paper 5. The recording paper 5 having undergone the fixing is cooled by the cooling unit 70 that absorbs heat from the recording paper 5 and from the toner images. Then, the recording paper 5 is decurled by the decurling unit 71. If the image forming operation does not need to be performed on the other side of the recording paper 5, the recording paper 5 is discharged by a pair of paper discharge rollers (not illustrated) through the switching member 72 to the paper discharge portion 73 provided on, for example, the outer side of the housing 1a.

If the image forming operation needs to be performed on the other side of the recording paper 5, the switching member 72 switches the direction of transport of the recording paper 5 that has been decurled to the direction toward the duplex transport path 57. Accordingly, the recording paper 5 is transported along the duplex transport path 57 and is temporarily held on the intermediate paper tray 58. The recording paper 5 held on the intermediate paper tray 58 with the front and back sides thereof having been reversed is fed into the paper-feeding-and-transporting path 55 via the duplex transport path 57 by the pair of feed rollers 59. In the paper-feeding-and-transporting path 55, the pair of paper transporting rollers 54 as registration rollers deliver the recording paper 5 to the second transfer position in accordance with the timing of the second transfer, and other toner images are transferred, for the second transfer, to the back side (a second side) of the recording paper 5.

Subsequently, as in the case of the image forming operation performed on the front side, the recording paper 5 having the toner images transferred to the back side thereof in the second transfer is transported to the fixing device 40 by the paper transporting devices 56a and 56b and undergoes the fixing operation. Then, the recording paper 5 and the toner images are cooled by the cooling unit 70, is decurled by the decurling unit 71, and is discharged through the switching member 72 onto the paper discharge portion 73.

Through the above series of processes, the recording paper 5 having a full-color image composed of the toner images in the four respective colors is output.

Referring to FIG. 1, a control device 100 controls the operation of the image forming apparatus 1, and the user inputs conditions for image forming operation and so forth on a user interface unit (UI unit) 101.

The image forming apparatus 1 may be configured such that the toner images formed by the imaging devices 10 (S1, S2, Y, M, C, and K) are directly transferred to the recording paper 5 without using the intermediate transfer belt 21 of the intermediate transfer device 20.

Featured Elements of Image Forming Apparatus

In the first exemplary embodiment, as illustrated in FIG. 3, the housing 45 of the fixing device 40 has an opening 62 at a position of the top face thereof that faces the heating roller 48. The opening 62 is provided in, for example, a central portion of the top face of the housing 45 in the axial direction of the heating roller 48. A first thermoelectric transducer 80 as a first thermoelectric converter that converts thermal energy dissipated from the heating roller 48 as a heat source into electrical energy is fitted in the opening 62 such that a heat absorbing surface 81 thereof corresponding to a high-temperature side faces the heating roller 48, and a heat dissipating surface 82 thereof corresponding to a low-temperature side is positioned on the outer side of the housing 45.

Furthermore, a second thermoelectric transducer 90 as a second thermoelectric converter that converts electrical energy into thermal energy is provided on the heat dissipating surface 82 of the first thermoelectric transducer 80. The second thermoelectric transducer 90 has a first surface 91 that is in contact with the heat dissipating surface 82 of the first thermoelectric transducer 80, and a second surface 92 that is exposed to the outside of the housing 45.

The heat dissipating surface 82 of the first thermoelectric transducer 80 and the first surface 91 of the second thermoelectric transducer 90 are closely in contact with each other with, for example, an insulating material (not illustrated) having good thermal conductivity interposed therebetween.

Figure 4:
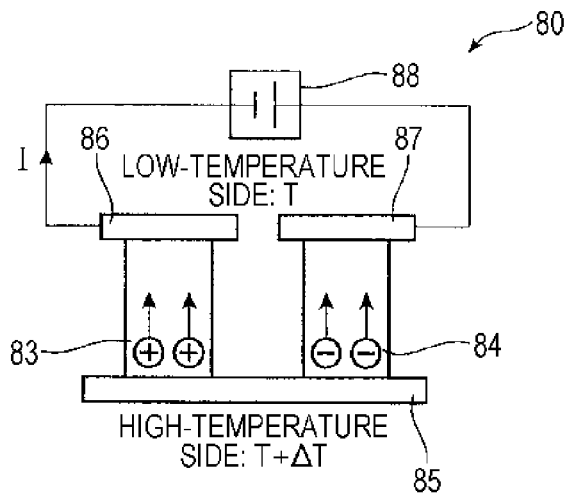
FIG. 4 is a schematic diagram of a first thermoelectric transducer.

FIG. 4 is a schematic diagram of the first thermoelectric transducer 80.

The first thermoelectric transducer 80 includes two elements that are made of different kinds of metals, semiconductors, or the like: namely, a p-semiconductor device 83 and an n-semiconductor device 84. Respective ends of the p-semiconductor device 83 and the n-semiconductor device 84 that are on one side are connected to each other via a conducting member 85. Respective ends of the p-semiconductor device 83 and the n-semiconductor device 84 that are on the other side are connected to each other via respective electrode terminals 86 and 87. In the first thermoelectric transducer 80, the side on which the p-semiconductor device 83 and the n-semiconductor device 84 are connected to each other via the conducting member 85 is defined as the high-temperature side (T+ΔT), and the side on which the p-semiconductor device 83 and the n-semiconductor device 84 are connected to each other via the electrode terminals 86 and 87 is defined as the low-temperature side (T). When a temperature difference (ΔT) is produced between the two ends of each of the p-semiconductor device 83 and the n-semiconductor device 84, a potential difference is produced between the electrode terminals 86 and 87 in accordance with the Seebeck effect. Thus, thermal energy is converted into electrical energy. The electrical energy obtained through the conversion by the first thermoelectric transducer 80 is stored in a capacitor device 88 such as a storage battery.

Figure 5A:
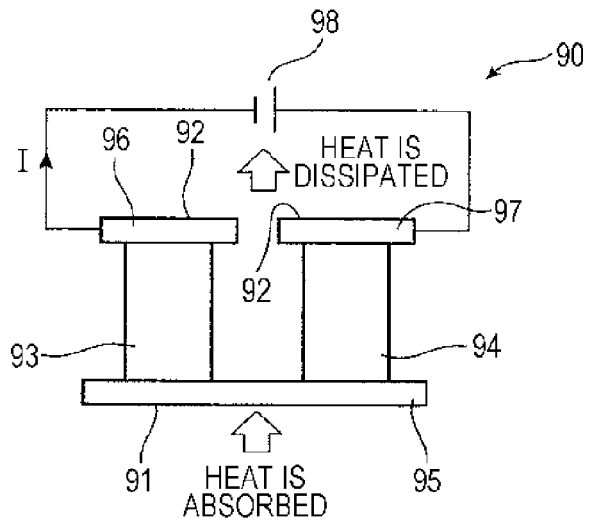
FIGS. 5A and 5B are schematic diagrams of a second thermoelectric transducer.
Figure 5B:
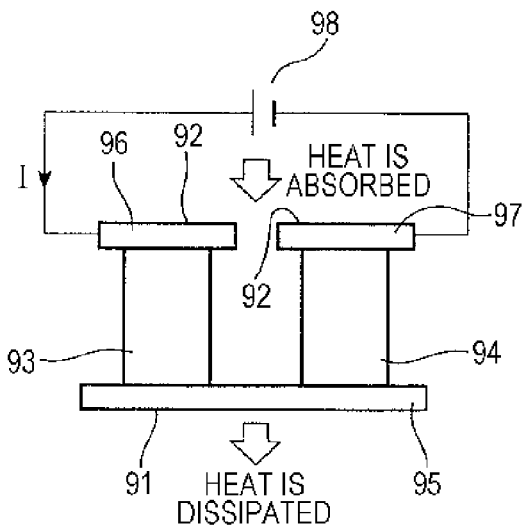

FIGS. 5A and 5B are schematic diagrams of the second thermoelectric transducer 90.

As with the first thermoelectric transducer 80, the second thermoelectric transducer 90 includes two elements that are made of different kinds of metals, semiconductors, or the like: namely, a p-semiconductor device 93 and an n-semiconductor device 94. Respective ends of the p-semiconductor device 93 and the n-semiconductor device 94 that are on one side are connected to each other via a conducting member 95. Respective ends of the p-semiconductor device 93 and the n-semiconductor device 94 that are on the other side are connected to each other via respective electrode terminals 96 and 97. As illustrated in FIG. 5A, when a direct current is made to flow between the electrode terminals 96 and 97 connected to the p-semiconductor device 93 and the n-semiconductor device 94, respectively, of the second thermoelectric transducer 90 from a direct-current power supply 98 such that the electrode terminal 97 connected to the n-semiconductor device 94 functions as the positive electrode and the electrode terminal 96 connected to the p-semiconductor device 93 functions as the negative electrode, the first surface 91 on the side of the conducting member 95 that connects the p-semiconductor device 93 and the n-semiconductor device 94 absorbs heat, whereas the second surface 92 on the side of the electrode terminals 96 and 97 dissipates heat, in accordance with the Peltier effect. Hence, if a direct current is supplied to the second thermoelectric transducer 90 such that the electrode terminal 97 connected to the n-semiconductor device 94 functions as the positive electrode, the first surface 91 on the side of the conducting member 95 is cooled.

As illustrated in FIG. 5B, when the polarity of the direct-current power supply 98 is reversed and a direct current is made to flow between the electrode terminals 96 and 97 connected to the p-semiconductor device 93 and the n-semiconductor device 94, respectively, of the second thermoelectric transducer 90 such that the electrode terminal 96 connected to the p-semiconductor device 93 functions as the positive electrode and the electrode terminal 97 connected to the n-semiconductor device 94 functions as the negative electrode, the second surface 92 on the side of the electrode terminals 96 and 97 connected to the p-semiconductor device 93 and the n-semiconductor device 94, respectively, absorbs heat, whereas the first surface 91 on the side of the conducting member 95 that connects the p-semiconductor device 93 and the n-semiconductor device 94 dissipates heat, in accordance with the Peltier effect. Hence, if a direct current is supplied to the second thermoelectric transducer 90 such that the electrode terminal 96 connected to the p-semiconductor device 93 functions as the positive electrode, the first surface 91 on the side of the conducting member 95 is heated.

The first and second thermoelectric transducers 80 and 90 may each include plural thermoelectric transducers, of course.

Figure 6:
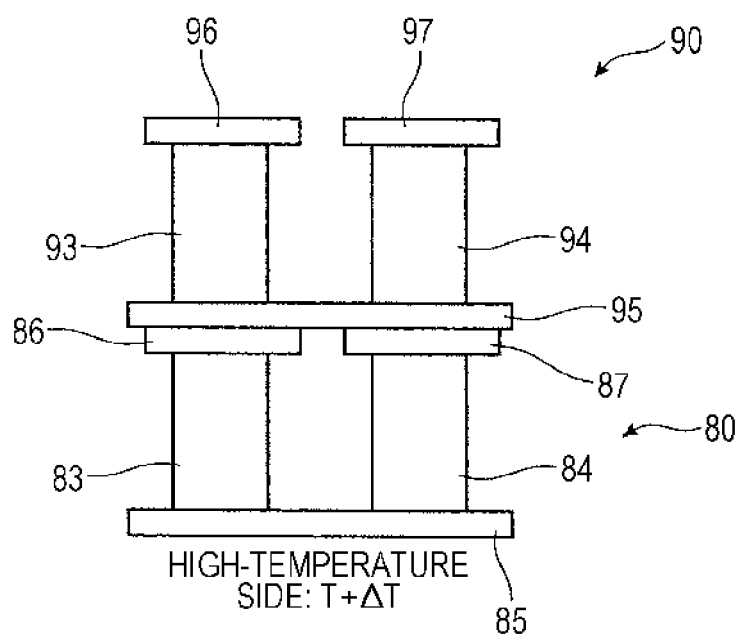
FIG. 6 is a schematic diagram illustrating the arrangement of the first thermoelectric transducer and the second thermoelectric transducer.

As illustrated in FIG. 6, the first thermoelectric transducer 80 and the second thermoelectric transducer 90 are stacked such that, as described above, the heat dissipating surface 82 on the low-temperature side of the first thermoelectric transducer 80 and the first surface 91 of the second thermoelectric transducer 90 are in contact with each other with the insulating material (not illustrated) having good thermal conductivity interposed therebetween.

Furthermore, as illustrated in FIG. 3, the heat absorbing surface 81 on the high-temperature side of the first thermoelectric transducer 80 is provided with a first temperature sensor 89$a$ as an exemplary first temperature detector that detects the temperature of the heat absorbing surface 81 of the first thermoelectric transducer 80. On the other hand, the heat dissipating surface 82 on the low-temperature side of the first thermoelectric transducer 80 is provided with a second temperature sensor 89$b$ as an exemplary second temperature detector that detects the temperature of the heat dissipating surface 82 of the first thermoelectric transducer 80.

Figure 7:
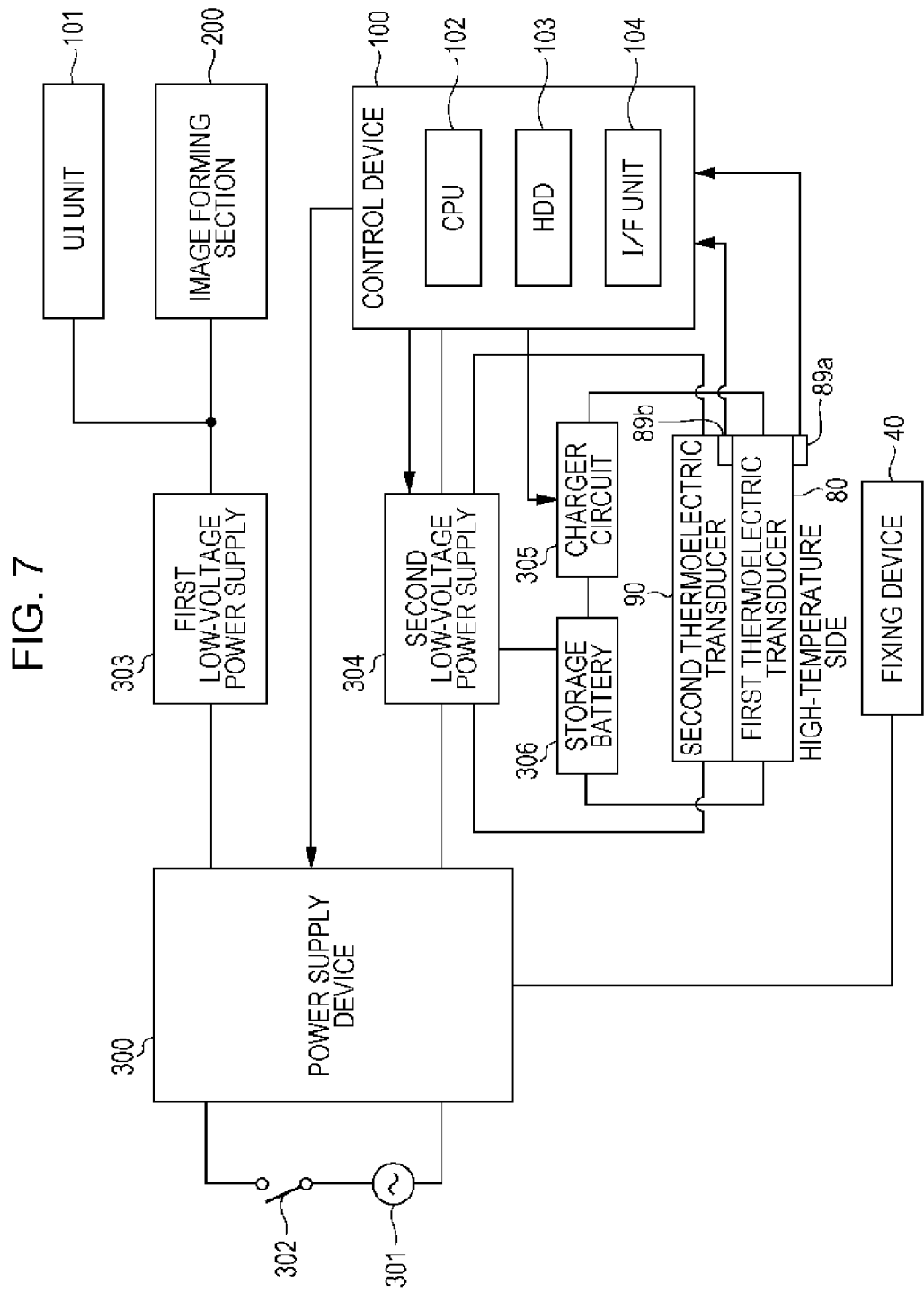
FIG. 7 is a block diagram illustrating a power supply circuit of the image forming apparatus.

FIG. 7 is a block diagram illustrating a power supply circuit of the image forming apparatus 1.

Referring to FIG. 7, power is supplied from a commercial power supply 301 (an alternating-current (AC) power supply at 100 V, for example) to a power supply device 300 of the image forming apparatus 1 via a power switch 302. The power supply device 300 is connected to a first low-voltage power supply 303 that converts the power supplied from the commercial power supply 301 into a direct-current voltage at a first voltage level (24 V, for example), and to a second low-voltage power supply 304 that converts the power supplied from the commercial power supply 301 into a direct-current voltage at a second voltage level (5 V, for example). The first low-voltage power supply 303 supplies the direct-current voltage at the first voltage level (24 V, for example) to the image forming section 200 and to the UI unit 101. The second low-voltage power supply 304 supplies the direct-current voltage at the second voltage level (5 V, for example) to the control device 100. The control device 100 includes a central processing unit (CPU) 102 that controls the operation of the image forming apparatus 1, a hard disk drive (HDD) 103 that stores programs to be executed by the CPU 102, image data, and so forth, and an interface unit (I/F unit) 104. The power supply device 300 controls the power to be supplied to the fixing device 40 on the basis of a control signal transmitted thereto from the control device 100.

The first thermoelectric transducer 80 is connected to a storage battery 306 via a charger circuit 305. The storage battery 306 is connected to the second low-voltage power supply 304 and supplies the direct-current voltage at the second voltage level to the first thermoelectric transducer 80 according to need or in place of the second low-voltage power supply 304. The second thermoelectric transducer 90 is also connected to the second low-voltage power supply 304. The supply of power to the second thermoelectric transducer 90 is controlled by the control device 100 that functions as a power supply controller. The control device 100 controls the switching of the direction of the direct current supplied to the second thermoelectric transducer 90, whether or not to supply power to the second thermoelectric transducer 90, and so forth on the basis of the temperature detection signals transmitted from the first and second temperature sensors 89$a$ and 89$b$.

Operations Performed by Featured Elements of Image Forming Apparatus

In the image forming apparatus 1 according to the first exemplary embodiment, energy is saved by efficiently utilizing the thermal energy dissipated from the fixing device 40 as described below.

When the image forming apparatus 1 receives a command that requires an image forming operation (printing), the four imaging devices 10 (Y, M, C, and K) and associated devices including the intermediate transfer device 20, the second transfer device 30, and the fixing device 40 are activated as described above.

In the fixing device 40, as illustrated in FIG. 3, the pressure roller 42 is driven by the driving device (not illustrated) and is thus rotated in the direction of the arrow. Furthermore, power is supplied from the power supply device 300 to the halogen heaters 481 provided in the heating roller 48, whereby the surface of the heating roller 48 is heated to a predetermined temperature (190° C., for example). When the temperature of the fixing belt 46 heated by the heating roller 48 reaches a predetermined temperature, the recording paper 5 having toner images yet to be fixed is introduced into the housing 45 of the fixing device 40 from the introducing port 43 and receives heat and pressure when passing through the nip N. Thus, the toner images are fixed to the recording paper 5, and the recording paper 5 is discharged from the discharge port 44. If the image forming operation is to be performed successively on plural pieces of recording paper 5, the fixing operation in which heat and pressure are applied to the recording paper 5 is performed successively on the plural pieces of recording paper 5 passing through the nip N in the state where the heating roller 48 has been heated to the predetermined temperature.

In the above process, a portion of the thermal energy dissipated from the heating roller 48 is conducted to the fixing belt 46 and is dissipated to the internal space of the housing 45 of the fixing device 40. The first thermoelectric transducer 80 is provided at a position of the housing 45 that faces the heating roller 48, with the heat absorbing surface 81 thereof on the high-temperature side facing the heating roller 48. Therefore, the conducting member 85 forming the heat absorbing surface 81 on the high-temperature side of the first thermoelectric transducer 80 is heated by the heat dissipated from the heating roller 48, and the temperature of the heat absorbing surface 81 rises gradually. On the other hand, the heat dissipating surface 82 on the low-temperature side of the first thermoelectric transducer 80 is in contact with the first surface 91 of the second thermoelectric transducer 90. The second thermoelectric transducer 90 is exposed to the outside of the housing 45. Therefore, in a state where the second thermoelectric transducer 90 is not powered, the second thermoelectric transducer 90 is at a temperature substantially equal to the temperature on the outside of the housing 45, i.e., the temperature in the housing 1$a$ of the image forming apparatus 1 (the room temperature).

Figure 8:
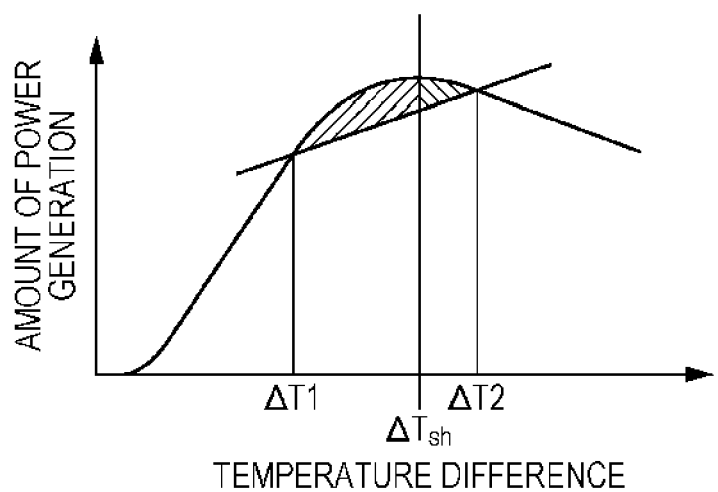
FIG. 8 is a graph illustrating the relationship between the temperature difference and the amount of power generation in the first thermoelectric transducer.

Referring now to FIG. 8, the amount of power (electromotive force) generated by the first thermoelectric transducer 80 changes with the temperature difference between the heat absorbing surface 81 on the high-temperature side and the heat dissipating surface 82 on the low-temperature side. The amount of power generated by the first thermoelectric transducer 80 increases with the increase in the temperature difference between the heat absorbing surface 81 on the high-temperature side and the heat dissipating surface 82 on the low-temperature side. However, when the temperature difference reaches a threshold $\Delta T_{sh}$, the conversion capacity of the first thermoelectric transducer 80 is saturated. In contrast, when the temperature difference exceeds the threshold $\Delta T_{sh}$, the amount of power generated by the first thermoelectric transducer 80 decreases. That is, when the temperature difference between the heat absorbing surface 81 on the high-temperature side and the heat dissipating surface 82 on the low-temperature side is smaller than or equal to the threshold $\Delta T_{sh}$, the amount of power generated by the first thermoelectric transducer 80 increases with the increase in the temperature difference. Accordingly, the efficiency of thermoelectric conversion increases.

Therefore, in the first exemplary embodiment, the control device 100 monitors the temperature difference between the heat absorbing surface 81 on the high-temperature side and the heat dissipating surface 82 on the low-temperature side of the first thermoelectric transducer 80 on the basis of the detection signals transmitted from the first and second temperature sensors 89a and 89b. If the control device 100 has determined that the temperature difference is smaller than or equal to the threshold $\Delta T_{sh}$, the control device 100 controls the second low-voltage power supply 304 to supply the direct current to the second thermoelectric transducer 90 such that the electrode terminal 97 functions as the positive electrode, whereby the heat dissipating surface 82 on the low-temperature side of the first thermoelectric transducer 80 is cooled by the heat absorbing effect occurring on the first surface 91 of the second thermoelectric transducer 90. Thus, the temperature difference between the heat absorbing surface 81 on the high-temperature side and the heat dissipating surface 82 on the low-temperature side of the first thermoelectric transducer 80 is increased, whereby the efficiency of thermoelectric conversion performed by the first thermoelectric transducer 80 is increased.

Figure 9:
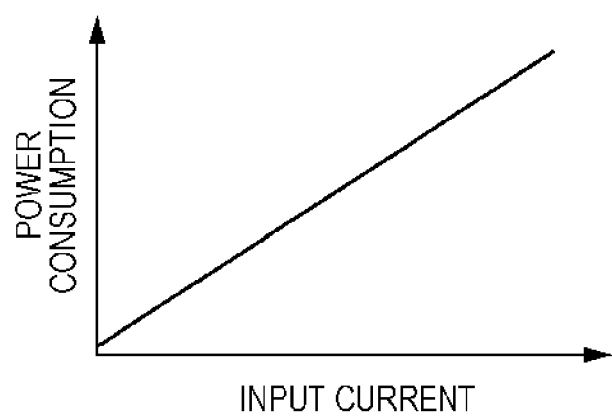
FIG. 9 is a graph illustrating the relationship between the input current and the amount of power consumption in the second thermoelectric transducer.

In such a configuration, referring now to FIG. 9, the second thermoelectric transducer 90 consumes power by receiving the direct current supplied from the second low-voltage power supply 304. Therefore, the control device 100 controls the first temperature sensor 89a and the second temperature sensor 89b to detect the temperature difference ($\Delta T$) between the heat absorbing surface 81 on the high-temperature side and the heat dissipating surface 82 on the low-temperature side of the first thermoelectric transducer 80. Then, if the amount of power generated by the first thermoelectric transducer 80 has reached the amount corresponding to a first temperature difference ($\Delta T1$) that exceeds the amount of power consumed by the second thermoelectric transducer 90, the control device 100 allows the supply of the direct current to the second thermoelectric transducer 90, so that the heat dissipating surface 82 on the low-temperature side of the first thermoelectric transducer 80 is cooled. Thus, the efficiency of thermoelectric conversion performed by the first thermoelectric transducer 80 is increased. If the control device 100 has determined that the amount of power generated by the first thermoelectric transducer 80 is smaller than the amount corresponding to the first temperature difference ($\Delta T1$), the control device 100 does not allow the power supply to the second thermoelectric transducer 90.

If the temperature of the heat absorbing surface 81 on the high-temperature side of the first thermoelectric transducer 80 has risen and the temperature difference between the heat absorbing surface 81 on the high-temperature side and the heat dissipating surface 82 on the low-temperature side of the first thermoelectric transducer 80 has exceeded the threshold $\Delta T_{sh}$, the control device 100 controls the second low-voltage power supply 304 to switch the direction in which the direct current is supplied to the second thermoelectric transducer 90 to the direction illustrated in FIG. 5B. Thus, the second thermoelectric transducer 90 absorbs heat from the second surface 92 on the side of the electrode terminals 96 and 97 and dissipates heat from the first surface 91 on the side of the conducting member 95. That is, the heat dissipating surface 82 on the low-temperature side of the first thermoelectric transducer 80 is heated by the second thermoelectric transducer 90. Consequently, the temperature difference between the heat absorbing surface 81 on the high-temperature side and the heat dissipating surface 82 on the low-temperature side of the first thermoelectric transducer 80 is maintained at a value substantially equal to or close to the threshold $\Delta T_{sh}$. Accordingly, even if the thermoelectric conversion capacity of the first thermoelectric transducer 80 is saturated, the efficiency of power generation is increased.

In the above case, however, the second thermoelectric transducer 90 consumes power with the supply of the direct current from the second low-voltage power supply 304 as graphed in FIG. 9. Therefore, the control device 100 controls the first temperature sensor 89a and the second temperature sensor 89b to detect the temperature difference ($\Delta T$) between the heat absorbing surface 81 on the high-temperature side and the heat dissipating surface 82 on the low-temperature side of the first thermoelectric transducer 80. Then, if the amount of power consumed by the second thermoelectric transducer 90 has reached the amount corresponding to a second temperature difference ($\Delta T2$) that exceeds the amount of power generated by the first thermoelectric transducer 80, the control device 100 stops the supply of the direct current to the second thermoelectric transducer 90.

To summarize, in the first exemplary embodiment, the second thermoelectric transducer 90 is provided on the heat dissipating surface 82 on the low-temperature side of the first thermoelectric transducer 80. Thus, the heat dissipating surface 82 on the low-temperature side of the first thermoelectric transducer 80 is cooled or heated in accordance with the temperature difference ($\Delta T$) between the heat absorbing surface 81 on the high-temperature side and the heat dissipating surface 82 on the low-temperature side of the first thermoelectric transducer 80. Consequently, the efficiency of power generation by the first thermoelectric transducer 80 is increased. Furthermore, the efficiency of power generation is increased even if the thermoelectric conversion capacity of the first thermoelectric transducer 80 is saturated.

Second Exemplary Embodiment

Figure 10:
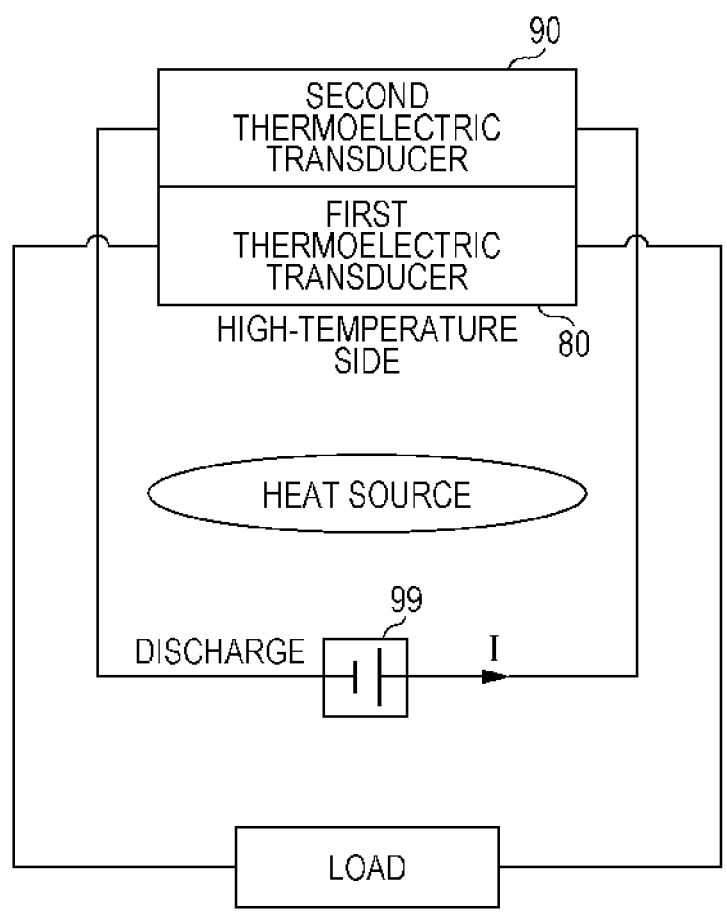
FIG. 10 is a block diagram illustrating a power supply circuit of an image forming apparatus as an exemplary electronic apparatus according to a second exemplary embodiment of the present invention.

FIG. 10 illustrates a configuration according to a second exemplary embodiment of the present invention.

In the second exemplary embodiment, the power generated by the first thermoelectric transducer 80 is supplied to a load including the control device 100 and so forth. A direct current is supplied to the second thermoelectric transducer 90 from a charging-and-discharging device 99 such as a storage battery. A switching circuit (not illustrated) is provided between the second thermoelectric transducer 90 and the charging-and-discharging device 99. The switching circuit switches the direction in which the direct current is supplied to the second thermoelectric transducer 90. Hence, the direction in which the direct current is supplied to the second thermoelectric transducer 90 is switchable.

In the second exemplary embodiment, as in the first exemplary embodiment, the efficiency of power generation by the first thermoelectric transducer 80 is increased, and the power is stably supplied to the load. Furthermore, as in the case illustrated in FIG. 7, the charging-and-discharging device 99 is charged by the second low-voltage power supply 304 or the like.

In the second exemplary embodiment also, the supply of power to the second thermoelectric transducer 90 is controlled such that the amount of power generated by the first thermoelectric transducer 80 always exceeds the amount of power consumed by the second thermoelectric transducer 90.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An electronic apparatus comprising:
   a first thermoelectric converter configured to convert thermal energy dissipated from a heat source into electrical energy;
   a second thermoelectric converter provided on a side of a low-temperature portion of the first thermoelectric converter and configured to convert electrical energy into thermal energy; and
   a power supply controller configured to control power supplied to the second thermoelectric converter such that the low-temperature portion of the first thermoelectric converter is cooled or heated,
   wherein the power supply controller is configured to control an amount of power supplied to the second thermoelectric converter to be smaller than an amount of electrical energy obtained through the conversion performed by the first thermoelectric converter,
   wherein the side of the low-temperature portion of the first thermoelectric converter is a heat dissipating side,
   wherein the first thermoelectric converter comprises a heat absorbing side opposite to the heat dissipating side, and
   wherein the second thermoelectric converter is configured to maintain a predetermined temperature difference between the heat absorbing side and the heat dissipating side.

2. The electronic apparatus according to claim 1, further comprising:
   first and second temperature detectors configured to detect temperatures on a side of a high-temperature portion and on the side of the low-temperature portion, respectively, of the first thermoelectric converter,
   wherein, in response to a temperature difference between the temperatures detected by the first and second temperature detectors being smaller than or equal to the predetermined temperature difference, the power supply controller controls the supply of power to the second thermoelectric converter such that the low-temperature portion of the first thermoelectric converter is cooled, and
   wherein, in response to the temperature difference between the temperatures detected by the first and second temperature detectors exceeding the predetermined temperature difference, the power supply controller controls the supply of power to the second thermoelectric converter such that the low-temperature portion of the first thermoelectric converter is heated.

3. The electronic apparatus according to claim 1, wherein the second thermoelectric converter includes a first terminal connected to a first terminal of the power supply controller, and a second terminal connected to a second terminal of the power supply controller.

4. The electronic apparatus according to claim 1, wherein the predetermined temperature difference is a temperature difference at which the first thermoelectric converter generates maximum power.

5. The electronic apparatus according to claim 1, further comprising:
   a housing which includes an opening, wherein
   the heat source is provided within the housing,
   the first thermoelectric converter is fitted in the opening such that the heat absorbing side of the first thermoelectric converter faces the heat source, and such that the heat dissipating side of the first thermoelectric converter is outside the housing,
   a first side of the second thermoelectric converter is in contact with the heat dissipating side of the first thermoelectric converter, and
   a second side of the second thermoelectric converter is outside the housing.

6. The electronic apparatus according to claim 1, wherein
   a first side of the second thermoelectric converter is in contact with a first side of an insulating material, and
   the heat dissipating side of the first thermoelectric converter is in contact with a second side of the insulating material, the second side of the insulating material being opposite to the first side of the insulating material.

7. The electronic apparatus according to claim 1, wherein the second thermoelectric converter is separated from the heat source by the first thermoelectric converter.

8. The electronic apparatus according to claim 1,
   wherein the first thermoelectric converter receives a first amount of heat from the heat source and the second thermoelectric converter receives a second amount of heat from the heat source, and
   wherein the first amount of heat is greater than the second amount of heat.

9. The electronic apparatus according to claim 1,
   wherein the second thermoelectric converter comprises a first side and a second side, the first side facing the heat dissipating side of the first thermoelectric converter and the second side being opposite to the first side, and
   wherein the second side is not directly exposed to the heat source.

10. The electronic apparatus according to claim 9,
   wherein the first side is not directly exposed to the heat source.

11. An image forming apparatus comprising:
   an image forming unit configured to form an image on a recording medium;
   a fixing unit configured to fix the image formed on the recording medium by heating the image;
   a first thermoelectric converter configured to convert thermal energy dissipated from the fixing unit into electrical energy;
   a second thermoelectric converter provided on a side of a low-temperature portion of the first thermoelectric converter and configured to convert electrical energy into thermal energy; and a power supply controller configured to control power supplied to the second thermoelectric converter such that the low-temperature portion of the first thermoelectric converter is cooled or heated, wherein the power supply controller is configured to control an amount of power supplied to the second thermoelectric converter to be smaller than an amount of electrical energy obtained through the conversion performed by the first thermoelectric converter, wherein the side of the low-temperature portion of the first thermoelectric converter is a heat dissipating side, wherein the first thermoelectric converter comprises a heat absorbing side opposite to the heat dissipating side, and wherein the second thermoelectric converter is configured to maintain a predetermined temperature difference between the heat absorbing side and the heat dissipating side.

12. The image forming apparatus according to claim 11, wherein the second thermoelectric converter includes a first terminal connected to a first terminal of the power supply controller, and a second terminal connected to a second terminal of the power supply controller.

13. An electronic apparatus comprising:

a first thermoelectric converter including a first conducting member, a first electrode, and a second electrode, the first thermoelectric converter being configured to convert thermal energy received by the first conducting member from a heat source into electrical energy;

a second thermoelectric converter including a second conducting member connected to the first and second electrodes, a third electrode, and a fourth electrode, the second thermoelectric converter being provided on a side of a low-temperature portion of the first thermoelectric converter and configured to convert electrical energy into thermal energy; and a power supply controller configured to control power supplied to the third and fourth electrodes such that the low-temperature portion of the first thermoelectric converter is cooled or heated, wherein the power supply controller is configured to control an amount of power supplied to the third and fourth electrodes to be smaller than an amount of electrical energy obtained through the conversion performed by the first thermoelectric converter, wherein the side of the low-temperature portion of the first thermoelectric converter is a heat dissipating side, wherein the first thermoelectric converter comprises a heat absorbing side opposite to the heat dissipating side, and wherein the second thermoelectric converter is configured to maintain a predetermined temperature difference between the heat absorbing side and the heat dissipating side.

* * * * *